United States Patent
Hobart et al.

(10) Patent No.: US 8,445,383 B2
(45) Date of Patent: May 21, 2013

(54) TRANSPARENT NANOCRYSTALLINE DIAMOND CONTACTS TO WIDE BANDGAP SEMICONDUCTOR DEVICES

(75) Inventors: Karl D. Hobart, Upper Marlboro, MD (US); Tatyana I Feygelson, Springfield, VA (US); Marko J Tadjer, Virginia Beach, VA (US); Joshua D. Caldwell, Accokeek, MD (US); Kendrick X Liu, Alexandria, VA (US); Francis J. Kub, Arnold, MD (US); Michael A Mastro, Fairfax, VA (US); James E Butler, Huntingtown, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 680 days.

(21) Appl. No.: 12/205,652

(22) Filed: Sep. 5, 2008

(65) Prior Publication Data
US 2009/0090918 A1   Apr. 9, 2009

Related U.S. Application Data

(60) Provisional application No. 60/969,998, filed on Sep. 5, 2007.

(51) Int. Cl.
*H01L 21/302* (2006.01)

(52) U.S. Cl.
USPC ............................................. 438/689

(58) Field of Classification Search
USPC ............................................. 438/689
See application file for complete search history.

(56) References Cited

U.S. PATENT DOCUMENTS

| | | | | |
|---|---|---|---|---|
| 5,578,901 | A | * | 11/1996 | Blanchet-Fincher et al. 313/496 |
| 5,795,653 | A | * | 8/1998 | Cuomo et al. ................ 428/408 |
| 6,670,705 | B1 | | 12/2003 | Harris et al. |
| 7,224,039 | B1 | * | 5/2007 | McGuire et al. ............. 257/532 |
| 2005/0019576 | A1 | * | 1/2005 | Dahl et al. ..................... 428/408 |
| 2005/0181131 | A1 | * | 8/2005 | Linares et al. ............. 427/249.8 |
| 2007/0082200 | A1 | | 4/2007 | Gruen |
| 2007/0106363 | A1 | * | 5/2007 | Weber ......................... 623/1.11 |
| 2007/0221119 | A1 | * | 9/2007 | Kimoto et al. ................. 117/84 |

(Continued)

FOREIGN PATENT DOCUMENTS

| | | |
|---|---|---|
| WO | WO-2005/056861 | 6/2005 |
| WO | WO-2007/041381 | 4/2007 |

OTHER PUBLICATIONS

A. V. Sumant, P.U.P.A. Gilbert, D. S. Grierson, A. R. Konicek, M. Abrecht, J. E. Butler, T. Feygelson, S. S. Rotter, R. W. Carpick, Diamond & Relat. Mater. 16, 718 (2007).

(Continued)

*Primary Examiner* — Charles Garber
*Assistant Examiner* — Andre' C Stevenson
(74) *Attorney, Agent, or Firm* — Amy Ressing; Roy Roberts

(57) ABSTRACT

A heterojunction between thin films of NCD and 4H—SiC was developed. Undoped and B-doped NCDs were deposited on both n– and p– SiC epilayers. I-V measurements on p+ NCD/n– SiC indicated Schottky rectifying behavior with a turn-on voltage of around 0.2 V. The current increased over eight orders of magnitude with an ideality factor of 1.17 at 30° C. Ideal energy-band diagrams suggested a possible conduction mechanism for electron transport from the SiC conduction band to either the valence band or acceptor level of the NCD film.

16 Claims, 3 Drawing Sheets

U.S. PATENT DOCUMENTS

| | | | | |
|---|---|---|---|---|
| 2007/0273263 A1* | 11/2007 | Hudspeth et al. | ............. | 313/309 |
| 2008/0073646 A1* | 3/2008 | Khan | ............................ | 257/64 |
| 2008/0074026 A1* | 3/2008 | Sakai et al. | ................... | 313/309 |
| 2009/0022969 A1* | 1/2009 | Zhang et al. | ................. | 428/216 |
| 2009/0258255 A1* | 10/2009 | Terashima et al. | ............. | 429/12 |

OTHER PUBLICATIONS

M. Nesladek, D. Tromson, C. Mer, P. Bergonzo, P. Hubik, and J. Mares, Appl. Phys. Lett. 88, 232111 (2006).

X. Li, Y. Hayashi, S. K. Lilov, and S. Nishino, J. of Electronic Mater. 27 (1) 1998.

Y. Itoh, Y. Simikawa, H. Umezawa, and H. Kawarada, Appl. Phys. Lett. 89, 203503 (2006).

J. Phillip, P. Hess, T. Feygelson, J.E. Butler, S. Chattopadhyay, K.H. Chen, and L.C. Chen, J. Appl. Phys. 93, 2164 (2003).

Z. Remes, A. Choukourov, J. Stuchlik, J. Potmesil, M. Vanecek, Diamond & Relat. Mater. 15, 745 (2006).

B. L. VanMil, K. K. Lew, R. L. Myers-Ward, R. T. Holm, D. K. Gaskill, and C. R. Eddy, Jr., Mater. Sci. Forum, 556-557, 125 (2007).

L. Sekaric, J. M. Parpia, H. G. Craighead, T. Feygelson, B. H. Houston, J. E. Butler, Appl. Phys. Lett. 81, 4455 (2002).

V. Y. Dolmatov, Russian Chemical Reviews 70 (7) 607-626 (2001).

N. Tumilty, M. Bevilacqua, S. Curat, H. Ye, and R. B. Jackman, 17th European Conf. on Diamond, Diamond-Like Materials, Carbon Nanotubes, Nitrides and Silicon Carbide, Estoril, Portugal, Sep. 3-8, 2006.

J. D. Caldwell, R. E. Stahlbush, O. J. Glembocki, K. X. Liu, and K. D. Hobart, J. Vac. Sci. Technol. B 24 (4) 2006.

D. K. Schroder, Semiconductor Material and Device Characterization, Wiley, New York, 1998, pp. 173-176.

S. M. Sze, Physics of Semiconductor Devices, Wiley, New York, 1981, pp. 285.

"Handbook Series on Semiconductor Parameters", M. Levinstein, S. Rumyantsev and M. Shur, eds., World Scientific, London, 1996.

J. Cui, J. Ristein, and L. Ley, Phys. Rev. Lett. 81, 429 (1998).

S. Y. Han and J.-L. Lee, Appl. Phys. Lett 84, 538 (2004).

E. Danielsson, C.-M. Zetterling, M. Östling, D. Tsvetkov, and V. A. Dmitriev, J. Appl. Phys. 91, 2372 (2002).

Davies, J., Chemistry and Physics of Carbon, R. L. Walker, Jr. and P. A. Thrower, eds., vol. 13, 1977, pp. 1-143.

Vermeulen, L. A. and R. J. Farrer, Diamond Research 1975, Suppl. Ind. Diam. Rev. (1975) 18-23.

F. Fuchs, J. Schmitz, J. D. Ralston, and P. Koidl, Phys. Rev. B 49 (19) 13638-13642 1994.

M. G. Ancona, J. B. Boos, N. Papanicolaou, W. Chang, B. R. Bennett, and D. Park, SISPAD Conference Proceedings, Sep. 3-5, 2003, pp. 295-298.

F. Maier, M. Riedel, B. Mantel, J. Ristein, and L. Ley, Phys. Rev. Lett. 85, 3472 (2000).

K. X. Liu, R. E. Stahlbush, S. I. Maximenko, and J. D. Caldwell, Appl. Phys. Lett. 90, 153503 (2007).

J. D. Caldwell, P. B. Klein, M. E. Twigg, R. E. Stahlbush, O. J. Glembocki, K. X. Liu, K. D. Hobart and F. Kub, Appl. Phys. Lett. 89, 103519 (2006).

L. Chang et al, Deposition of heteroepitaxial diamond on 6H-SiC single crystal by bias-enhanced microwave plasma chemical vapor deposition, Diamond and Related Materials 9 (2000) 283-289.

L. Sekaric, et.al., Nanomechanical resonant structures in nanocrystalline diamond, Appl. Phys. Lett., vol. 81, 4455 (2002).

Baldwin et al., J. Vac. Sci. Technol. B, 24, 50 (2006).

Metcalf, et al., Appl. Phys. Letters, 86, 081910 (2005).

Yang, et al., Appl. Phys. Letters, 85, 3626 (2004).

* cited by examiner

TRANSPARENT NANOCRYSTALLINE DIAMOND CONTACTS TO WIDE BANDGAP SEMICONDUCTOR DEVICES

CROSS-REFERENCE TO RELATED APPLICATIONS

This Application is a Non-Prov of Prov (35 USC 119(e)) application 60/969,998 filed on Sep. 5, 2007, the entirety of which is incorporated herein by reference.

STATEMENT REGARDING FEDERALLY SPONSORED RESEARCH OR DEVELOPMENT

Not applicable.

REFERENCE TO A COMPACT DISK APPENDIX

Not applicable.

BACKGROUND OF THE INVENTION

Semiconductor devices have been used within electronics increasingly each year ever since their initial invention in 1947. While the majority of the semiconductor market is made up of silicon-based technology, wide-band gap semiconductors such as silicon carbide and gallium nitride are finding a number of applications in RF, microwave, power switching electronics, light emitting devices such as LEDs and laser diodes, and UV detectors.

Currently, conductive thin films are available for the majority of the IR-visible range of the spectrum, however, similar films for the ultra-violet range are lacking. Such ultra-violet range films may be useful as a topside electrical contact for optical beam induced current imaging studies of defects or photoconductivity measurements in wide-band gap semiconductors, as a topside electrical contact for UV detectors, as a contact and current spreading layer for UV LEDs, as a gate contact for wide-band gap (SiC, GaN and AlN and their alloys: $Al_xGa_{1-x}N$) field effect transistor (FET) structures, and as rectifying and ohmic contacts for power switching diodes.

Currently, difficulties in growth have led to a wide array of extended and microscopic (in some cases only several nanometers in size) defects in wide-band gap materials which have thus hindered their marketability. Techniques such as optical beam induced current (OBIC) provide the unique capability of being able to image not only the presence of a defect, but its electrical activity under forward and reverse bias conditions and is not severely limited (as in the case of electron beam induced current) by the penetration depth of the carrier irradiation source. However, for defect analysis, OBIC requires a top and back side contact to a device. Therefore a method for allowing the above-band gap light to reach the underlying sample of interest (below the contacts) is also desirable. Since the metal contacts that are traditionally used in semiconductor technology are not transparent to light, they are not conducive for OBIC studies, thereby limiting the use of OBIC in semiconductor defect analysis. Metal contact patterns such as grids are not particularly useful for samples where the top semiconductor material layer has low conductivity, and, furthermore, they cover up some of the material being studied, hiding it from imaging. Minority carriers generated in excess of one diffusion length from a top metal contact will not be collected in the OBIC measurement, thus requiring a dense grid metal which obscures the features of interest.

Imaging of defects within wafers should be completed as early in the growth process as possible in order to save on wasted material and to study these defects during the subsequent growth and processing steps in an effort to minimize their future impact. Other conductive thin films used as transparent contacts for silicon technology, such as indium tin oxide or zinc oxide, are highly absorptive in the ultra-violet wavelengths and therefore do not allow sufficient excitation of electrical carriers for wide band gap studies. As the band gap of these materials is well into the ultra-violet (3.2 and 3.4 eV for 4H—SiC and GaN, respectively), a material that is relatively transparent in the ultraviolet wavelengths that will strongly adhere to the semiconductor surface and provide sufficient conductivity for OBIC or photoconductivity measurements to be completed would be beneficial. Furthermore, such a material would be required for UV transparent contacts needed for improving devices based on these materials that will become available as these technologies mature.

Wide bandgap optoelectronic devices such as emitters (LEDs, Lasers) and detectors (photodiodes, avalanche photodiodes) can benefit from conductive transparent contacts. Transparent contacts can significantly reduce the 'shadow' of a conventional metal contact and permit more light to exit (emitter) or enter (detector) the device. Transparent contacts can also be used in conjunction with metal contacts (especially in light emitting devices), to act as a current spreading layer thereby improving and optimizing the current uniformity and thus the light output uniformity over the device area. Conventional transparent conductive films, such as Indium Tin Oxide (ITO), are not sufficiently transparent in the UV and near UV spectrum.

BRIEF SUMMARY OF THE INVENTION

Disclosed is an article of manufacture comprising a nanocrystalline diamond film deposited on a semiconducting structure and method for making same. The semiconducting structure is typically SiC or GaN. The SiC may be epitaxial layers. The SiC may be 4H—SiC. The nanocrystalline diamond film n-type or p-type doped films or undoped films. The semiconducting structure can be either a wide-band gap semiconductor or a narrow-band gap semiconductor. The article of manufacture of claim 1 wherein said nanocrystalline diamond film has a thickness of about 1 µm or less and has an optical transmission ranging from about 200 nm to about 900 nm in wavelength.

DETAILED DESCRIPTION OF THE INVENTION

Figure 1A:
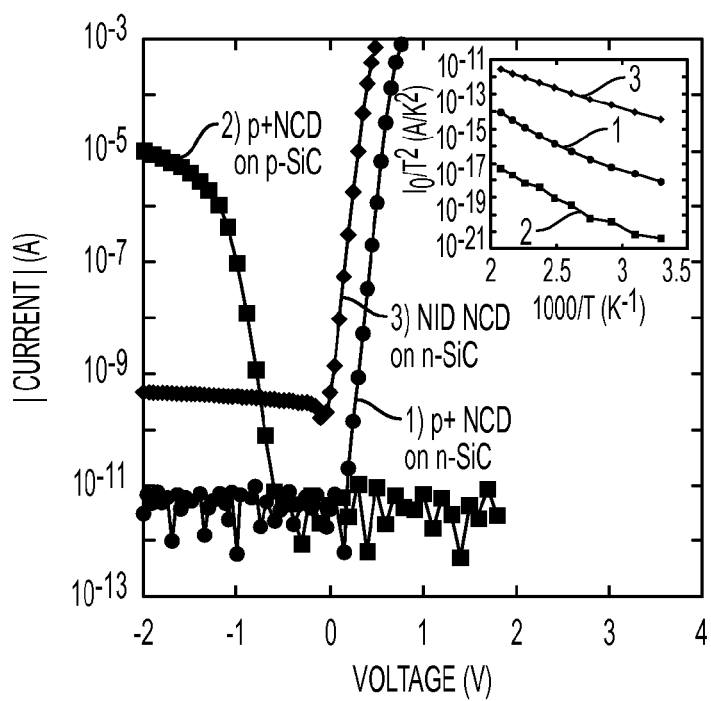
FIG. 1 shows the Current-voltage characteristics and capacitance-voltage data.

Nanocrystalline diamond (NCD) thin films are of interest due to their large-band-gap and excellent thermal properties, which make them attractive for power device applications. The thermal conductivity of NCD films with a nucleation density larger than $10^{12}$ $cm^{-2}$ has been shown to reach 12.7 W/cm-K for a 3.5 µm thick film. The UV semitransparency of NCD films has been previously reported on other substrates. Disclosed herein are both doped and undoped NCD films that can also be used as an electrical contact for both n- and p-type 4H—SiC, allowing for the simultaneous measurement of both the optical and electrical characteristics of wide-band-gap semiconductor devices.

Undoped nanocrystalline diamond (NCD) (40-65% transmittance in 300-450 nm range) films may be useful as a surface passivation layer for wide bandgap power electronic applications such as high voltage and/or high temperature electronic devices. The NCD contacts to SiC can be ohmic in nature or rectifying depending on the properties of the NCD and the underlying wide bandgap semiconductor. Strongly rectifying contacts have applications for efficient power switching diode device applications. A low temperature growth procedure deposits both boron-doped and undoped NCD films that may range in thickness, for example from hundreds of nanometers to several micrometers thick. Current technology involving irradiation of p-type, boron-doped NCD films with deuterium has been demonstrated as a method for attaining n-type films. The films may be selectively removed, and thus are non-destructive to the underlying material, and patternable via photolithographic techniques. Finally, the similar indices of refraction between NCD and GaN, make it ideal for reducing total internal reflection and in DBR mirrors on GaN-based electronics.

A thin-film (<1 µm) boron-doped or undoped NCD is deposited onto semiconductor structures, for example via a microwave plasma technique. An intense cleaning of the substrate prior to NCD deposition is preferred. The cleaning may involve a piranha etch (3:1 mix of concentrated $H_2SO_4$: $H_2O_2$), SC-1 solution (1:1:6 mix of $NH_3OH$:$H_2O_2$:$H_2O$) and finally immersion in concentrated or dilute HF acid. The substrate is then exposed to a suspension of nanodiamond particles (1-10 nanometer) in solution, e.g., ethanol. The NCD film growth may be carried out at between about 600° C. and about 800° C. in a microwave plasma CVD system. To achieve p-type doping in the NCD film, diborane gas may be fed into the system during growth and carrier concentrations of 1E16-1E20 $cm^{-3}$ can be achieved. In the absence of this gas, undoped films may be deposited, however, it should be noted that separate vacuum chambers are preferred to ensure boron contamination is not present in the undoped films. These undoped films have been observed with resistivities larger than $10^{12}$ ohm-cm. Self-aligned contacts and NCD mesas have been reported as a method for creating specific contact and mesa patterns. Blanket NCD films may be etched within an oxygen rich environment at elevated temperatures or in a plasma assisted oxygen etch system such as a reactive ion etcher with appropriate masking. Such a process may also be used to remove the film completely since the oxidation of NCD either by thermal oxidation or by plasma oxide etching is much faster in NCD than other materials (1E6 times faster than in SiC for instance).

There are several advantages are observed for these films. These include the high adhesion of the layer to semiconductor films, high conductivity (for doped films), high optical transmission over a wide range of wavelengths (200-900 nm), tunability of the transmission at distinct wavelengths based on film thickness, ability for clean removal from surface (non-destructive) and capability for lithographic patterning. In terms of GaN-based opto-electronic devices, the similarity in the index of refraction of GaN and NCD films enable it to provide a UV-transparent, conductive contact film, that also should improve the optical extraction efficiency due to a reduction in total internal reflection. Furthermore, the very large band gap of diamond (5.46-5.60 eV; 227-221 nm) ensures that all electrical carriers optically excited will only be induced within the semiconductor of interest, not within the diamond film. This technology will provide advantages for bulk and epitaxial semiconductor manufacturing, semiconductor device processing and quality analysis, solid state lighting and photo-detector devices. It also has a possible use as a conductive or insulating layer in a top- or bottom-side DBR mirror and may enable high efficiency GaN-based VCSEL technology.

Several alternatives for doping are possible leading to n-type (phosphorus, deuterium irradiated boron-doped films), p-type (boron or aluminum) or nominally undoped NCD films, thereby providing a wide array of possible conductivities, ranging from semi-insulating to metal-like conduction. These films may be deposited on a wide array of materials including wide and narrow band gap semiconductors, and may be used as a contact within device structures or for defect imaging/quality analysis purposes. Few alternatives to wide band gap NCD are otherwise available: very thin metal films of titanium for instance have low UV absorption but the conductivity of these films is likewise very poor.

EXAMPLES

A heterojunction between thin films of NCD and 4H—SiC was developed. Undoped and B-doped NCDs were deposited on both n– and p– SiC epilayers. I-V measurements on p+ NCD/n– SiC indicated Schottky rectifying behavior with a turn-on voltage of around 0.2 V. The current increased over eight orders of magnitude with an ideality factor of 1.17 at 30° C. Ideal energy-band diagrams suggested a possible conduction mechanism for electron transport from the SiC conduction band to either the valence band or acceptor level of the NCD film.

Three sample structures were used, with the NCD grown via microwave plasma-enhanced chemical vapor deposition (CVD). The sample structures were (1) 0.5 µm thick B-doped $p^+$ NCD on a 5 µm $n^-$ 4H—SiC epitaxial layer, (2) a similar NCD film on a 10 µm $p^-$ 4H—SiC epilayer, and (3) an doped NCD film on a 10 µm $n^-$ 4H—SiC epilayer. All SiC epilayers were grown on 8° off <0001> toward <11-20> 4H—SiC $n^+$ (n>$1\times10^{18}$ $cm^{-3}$) substrates. The n- and p-type SiC epilayers had carrier concentrations of approximately $2\times10^{16}$ $cm^{-3}$ and was of very high quality. Details of the SiC epitaxial growth have been reported. The NCD films in all cases were ≦0.5 µm in thickness.

The SiC samples were initially cleaned in 4:1 $H_2SO_4$:$H_2O_2$ (piranha clean) for 10 min, followed by 10 min in 1:1:5 $NH_4OH$:$H_2O_2$:$H_2O$ (SC-1 clean), and finally immersed in 37% HF for 1 min. They were then exposed to a nanodiamond-ethanol suspension solution to provide a seeded surface for diamond growth. See, Sekaric, et. al, Appl. Phys. Lett. 81, 4455 (2002) and Dolmatov, Russ. Chem. Rev. 70, 607 (2001). Film growth was initiated in a dilute methane atmosphere at approximately 750° C. in a microwave plasma enhanced CVD system. Diborane introduced in the growth was sufficient to yield ~$7\times10^{19}$ atoms/$cm^2$, which was expected to give a hole concentration of $(1-10)\times10^{18}$ $cm^{-3}$. The undoped NCD film was grown in a separate chamber that was not contaminated with boron and therefore was capable of producing extremely pure films with very high resistivity (>$10^{10}$ ohm-cm).

Circular 350 µm diameter, 300 nm thick Al contacts were deposited onto the front side of the samples for use in I-V and C-V measurements. For the electroluminescence (EL) and optical beam induced current (OBIC) measurements, the contacts were a rectangular grid with open spaces to allow for light collection, as shown in FIG. 2. A blanket Al film was also deposited on the back side of all samples to lower the contact resistance. Device isolation was achieved by an $O_2$-reactive ion etching using the Al layer as a mask. Two-point I-V measurements were performed using an HP4145B semiconductor parameter analyzer using the probe station chuck as a back side contact. The C-V measurements were performed using an HP4275A LCR meter.

Figure 1B:
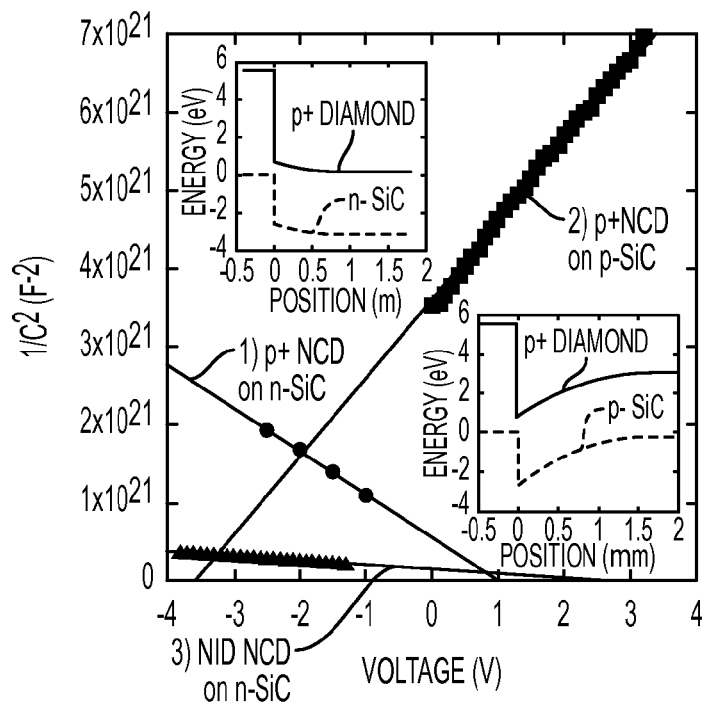

All three samples exhibited a highly Schottky-like rectifying behavior (FIG. 1), suggesting a metallic nature for the $p^+$ NCD film. In the case of $p^+$ NCD/$n^-$ SiC, a forward-bias exponential increase in the current was observed over eight orders of magnitude. The ideality factor ranged between n=1.17 at 30° C. and 1.07 at 210° C. In contrast, the p+ NCD on p– SiC fell between n=1.92 at 30° C. and 1.75 at 210° C. The ideality factor of the undoped NCD film on n– SiC was found to be similar to that of the p+ NCD on n– SiC, with values between n=1.14 at 30° C. and 0.93 at 210° C. The relative stability of the I-V characteristics with temperature and the negligible reverse leakage current levels (~$10^{-8}$ A/cm$^2$ and up to $3\times10^{-7}$ A/cm$^2$ at –20 V for p+ NCD on n– SiC) demonstrate that NCD is a versatile high-temperature contact to 4H—SiC. FIG. 1a shows the Current-voltage characteristics of the three samples. The inset shows the Richardson plot from the current-temperature method used to determine the barrier heights. FIG. 1b shows the capacitance-voltage data used to determine the barrier height of each heterojunction. The two insets show the ideal energy-band diagrams of diamond on n– and p– SiC.

Due to nonuniformities in the nanodiamond seed layer, the size of the electrically active area under the Al contacts may not be known exactly. For this reason, and because the Richardson's constant A for this heterojunction is currently unknown, a standard current-temperature barrier height measurement method was employed. In general, Schottky barrier height is defined as the difference between the metal work function $\phi_M$ and the semiconductor electron affinity $\chi$. For the p+ NCD/n– SiC sample, the corresponding barrier height was the energy difference between the NCD Fermi level and the SiC conduction band. An exponential fit was performed on the measured current to obtain a value for the current $I_0$ at zero bias ($V_F$=0 V). The barrier height $\phi_B$ was calculated from the Richardson plot [FIG. 1(a) inset] via the slope of the Arrhenius expression $\ln(I_0/T^2)=\ln(A_e A^{})-q(\phi_B-V_F)/kT$, where $A_e$ is the size of the electrically active area and k is Boltzmann's constant. The nonlinear nature of some curves on the Richardson plot suggested a temperature dependent barrier height. However, from a linear fit of the data in FIG. 1(a) inset, the extracted values of $\phi_B$ for p$^+$ NCD/n$^-$ SiC, p$^+$ NCD/p$^-$ SiC, and undoped NCD/n–SiC were 0.84, 0.74, and 0.47 eV, respectively.

Independent capacitance-voltage measurements of the barrier heights are shown in FIG. 1(b). In this method, the barrier height is related to the x-axis intercept $V_i$ by $\phi_B=-V_i+V_0+kT/q$, where $V_0$ is the bulk potential of the SiC epilayer based on the effective density of states ($3.25\times10^{15}T^{3/2}$ cm$^{-3}$) rather than the intrinsic carrier concentration. Using this approach, the barrier heights were found to be 0.82, 2.35, and 3.8 eV for the p$^+$ NCD/n$^-$ SiC, p$^+$ NCD/p$^-$ SiC, and undoped NCD/n$^-$ SiC, respectively. The discrepancies between the barrier heights extracted using the I-V and C-V methods are discussed later in this letter.

Ideal energy-band diagrams were calculated using the Silvaco device simulator for p$^+$ diamond on n$^-$ and p$^-$ SiC and are shown in the insets FIG. 1(b). For simulation purposes, H-terminated diamond electron affinity of $\chi$=–1.2 eV and band gap of $E_G$=5.5 eV were used. A type-II heterojunction behavior was determined, where $\chi_{NCD}<\chi_{SiC}$ and $\chi_{NCD}+E_{G,NCD}<\chi_{4H\_SiC}+E_{G,4H\_SiC}$, with $\chi_{4H\_SiC}$=3.5 eV and $E_{G,4H\_SiC}$=3.2 eV. From these simulations, a possible conduction path can be identified between the conduction band of the SiC and the B-impurity band of the NCD. Another conduction mechanism could be trap-assisted tunneling at the NCD-SiC interface due to the close proximity of the bands at the NCD/SiC interface. A trap-assisted-tunneling model was proposed by Danielsson et al., J. Appl. Phys. 91, 2372 (2002) for the case of the GaN—SiC heterojunction. Here, the exact doping and quality of the seed layer from which the NCD film was nucleated are currently unknown and may itself act as a metal-like conductor. It is known, however, that the significant concentration of nitrogen in the nanodiamond seed found to reside 1.7-4 eV below the conduction band would be too deep to sufficiently increase the film conductivity. Finally, spatially indirect generation processes in type-II heterojunctions can occur due to wave function overlap between electrons in the conduction band and holes in the valence band without the assistance of traps at the interface. Such processes have been experimentally observed via photoluminescence and modeled using density-gradient theory.

The presence of defects at the NCD-SiC interface helps explain the mismatch between the I-V and C-V extracted barrier heights. The barrier height extracted using I-V data was from a forward-biased junction, where both trap-assisted tunneling and band-to-band recombination may have taken place. This barrier height would represent the lower-barrier regions on the device where preferential injection took place due to the presence of interface traps. On the other hand, the C-V data were measured in the depletion region, which corresponded to the reverse bias of the I-V data. As such, C-V analysis did not account for trapping effects because the carriers were repelled from the interface, and the barrier height calculated was an average value over the entire device area. Defects at the interface can act either as recombination centers or intermediate states for trap-assisted tunneling currents, and both mechanisms raise n and lower the I-V extracted $\phi_B$. This was the case for both p$^+$ NCD/p$^-$ SiC and undoped NCD/n–SiC samples (1.61 and 3.33 eV mismatch, respectively). The larger mismatch for the undoped NCD sample could be partially attributed to additional barrier lowering induced by the approximately $10^{13}$ cm$^{-3}$ hole accumulation layer at the surface of undoped H-terminated diamond. However, such charge density was not enough to account for the 1.72 eV difference in barrier height between the two samples.

Figures 2A, 2B:
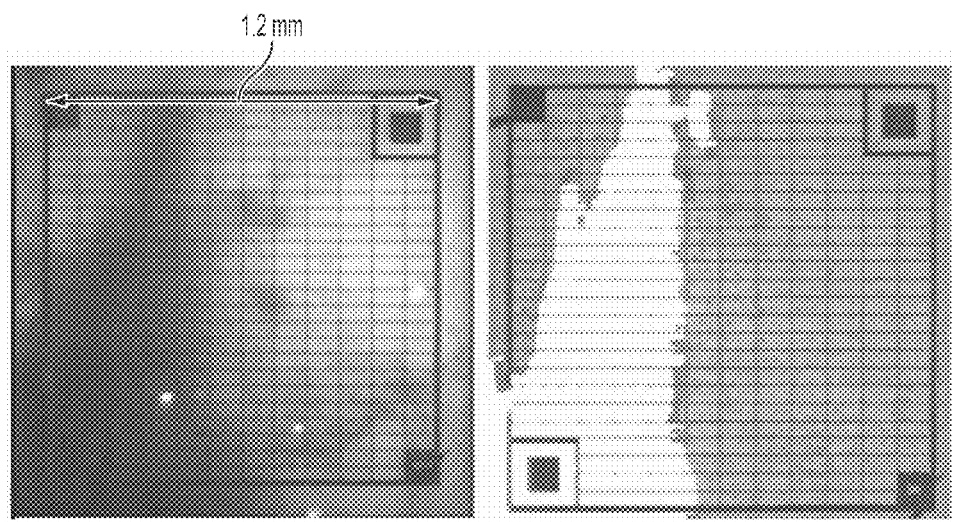
FIG. 2 is a device where the contacts were a rectangular grid with open spaces to allow for light collection.
Figure 3:
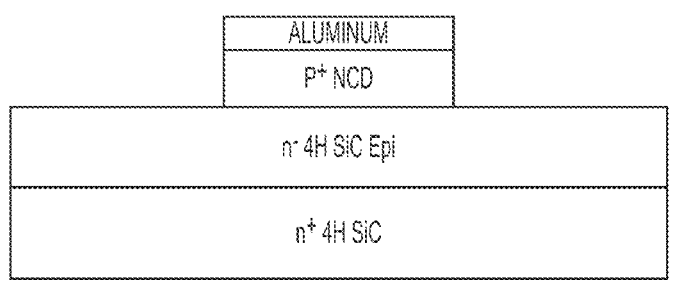
FIG. 3 shows a simple test structure of the present invention.

OBIC and EL images, presented in FIGS. 2(a) and 2(b), revealed two important applications for NCD films. The NCD film were used as an UV-semitransparent contact to the underlying epitaxial layer to perform optical measurements, and as a Schottky electrical contact to provide a means of forward biasing these junctions while still allowing light to be externally collected. The UV transmittance of the films matched closely to the values reported previously by Remes et al., Diamond Relat. Mater. 15, 745 (2006). The B-doped films had approximately 52% transmission at 351.0 nm, 58.8% at 363.8 nm (the two UV lines that were used for OBIC imaging), and 70.2% on average across the visible range. UV transmittance was higher for the B-doped NCD samples than the undoped ones. In the EL image, the bright spots exhibited a yellow-blue luminescence, and therefore could be tentatively identified as threading edge dislocations. A dark (bright) triangular-shaped defect dominates the EL (OBIC) images and was found to correspond to a region of a 6H—SiC polytype inclusion.

Other applications for NCD include, but are not limited to, improving light extraction from GaN-based emitters, Double Bragg reflector (DBR), vertical-cavity surface-emitting laser (VCSEL), resonant cavity LED (RCLED), surface passivation, and forming heterojunctions with other wide bandgap materials such as SiC and GaN.

Figure 4:
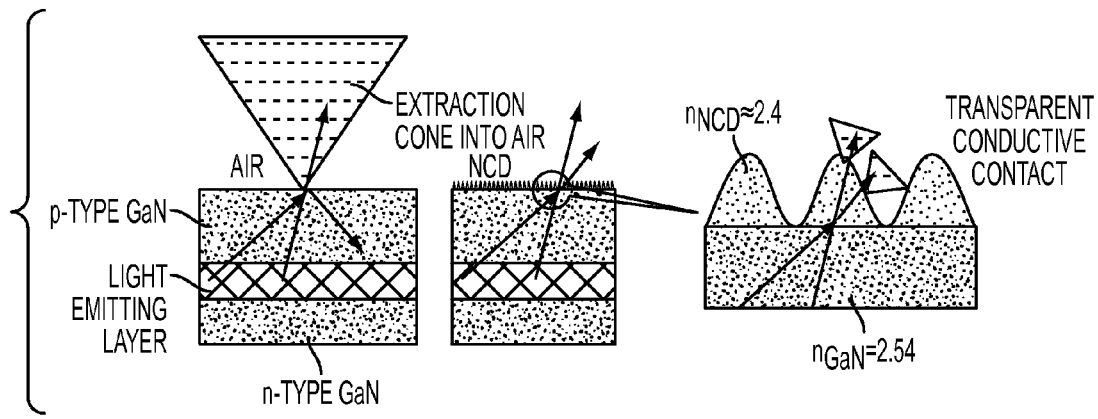
FIG. 4 shows how NCD improves light extraction from GaN-based emitters.

Due to the similar index of refraction of diamond and GaN, the roughened surface of the Nanocrystalline Diamond (NCD) films provide an ideal film for improving light extraction from GaN-based emitters. Due to Snell's law, most electroluminescence suffers from total internal reflection and therefore does not exit the device at the surface, leading to a low surface extraction efficiency of approximately 4%. It has been found that roughening the surface of the GaN can greatly improve the optical extraction efficiency by creating multiple exiting pathways for the electrically stimulated light, however, the roughened surface drastically degrades the electrical characteristics of the layer. NCD films have been demonstrated to have a roughened surface that would appear to be appropriate for reducing total internal reflections and have been demonstrated to have good electrical characteristics. The close match in the index of refraction ($n_{NCD}$~2.4, $n_{GaN}$~2.54) implies that very little reflections would occur at this interface and finally, the transparency of the NCD films in the UV spectral range would allow for sufficient light to pass. All of these properties would allow for greatly improved light extraction from GaN based emitters. A schematic of this scheme is presented in FIG. 4.

Figure 5:
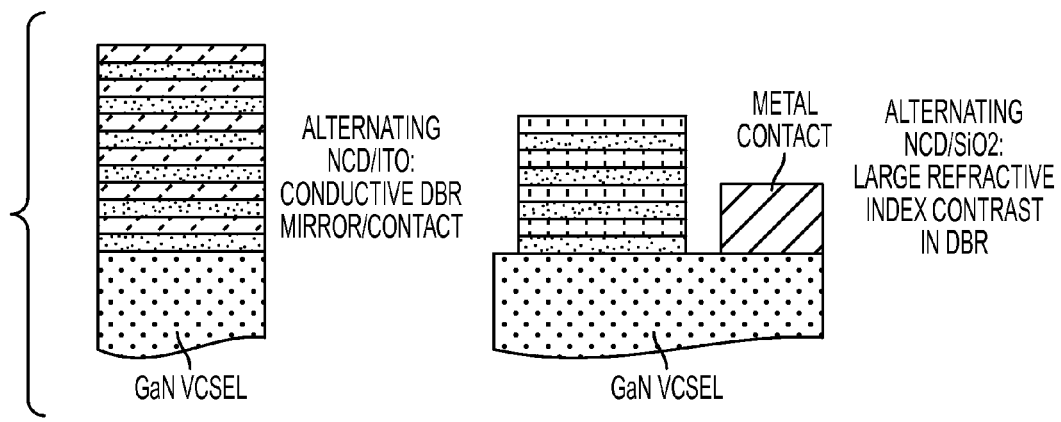
FIG. 5 is a schematic of BRAGG contact to VCSEL.

Double Bragg reflector (DBR), which is a repeating series of two materials with differing indexes of refraction, offer a high reflectance mirror improving the internal and external quantum efficiency of a light-emitting device. While bottom DBR mirrors have been demonstrated in GaN-based devices, the materials used are naturally insulating and therefore are not suitable for a top-side mirror. The ability of NCD to be either highly resistive or conductive, along with its large index of refraction and high transmission in the UV, would enable NCD films to be alternated with oxide films, such as $SiO_2$ for insulating bottom-side DBR mirrors or with conductive films such as ITO to provide a top-side DBR mirror. These two mirrors could also be combined with a GaN-based quantum well device into a vertical-cavity surface-emitting laser (VCSEL), which could enable drastic improvements in optical power outputs of UV laser diodes. FIG. 5 is a schematic of BRAGG contact to VCSEL.

A similar structure to a DBR is a resonant cavity LED (RCLED) where the thin light emitting region has an optical thickness on the order of the emission wavelength and includes both (DBR) top and (DBR or metallic) bottom mirrors. The bottom mirror consists of a high reflectance (R2>95%) multi-layer Bragg mirror or single-layer metal layer. The top mirror is of lower reflectance (40%>R1>70%) to allow greater transmission. Thus, a multi-layer Bragg mirror is typically used for the top mirror to minimize absorption. External extraction efficiency is significantly enhanced in a RCLED through a redistribution of the spontaneous emission pattern into the desired extraction cone. The use of NCD in the DBR layers in a RCLED provides comparable improvements as described for the DBR layers in a VCSEL.

Surface passivation techniques are often used for wide bandgap power switching and RF/microwave devices to preserve the materials properties near the surface and/or terminate high fields that may exist near the device surface. Wide bandgap devices are unique because they exhibit very high bulk breakdown or critical electric field and can thus sustain very high voltages compared to common semiconductors such as silicon. However, due to the high fields demanded of these devices, the electric field at the surface are often terminated to prevent surface breakdown. It is possible to use wide bandgap films or layers which can conformally coat a surface to prevent surface breakdown. Additionally, these passivating films can be made semi-resistive to further reduce the surface field. A NCD film would be applicable as the resistivity can be varied over many orders of magnitude from conducting to insulating. The thermal behavior of wide bandgap films such as NCD is an additional advantage since these materials will retain their good properties even at similar elevated temperature where wide bandgap SiC and GaN devices have excellent performance characteristics.

Wide bandgap NCD layers on other wide bandgap materials such as SiC and GaN form a heterojunction. The band offsets can be modulated depending whether the NCD is hydrogen or oxygen terminated resulting in a band gap shift of approximately 3 eV. This modulation of the relative band offsets allows a variety of heterojunctions to be formed. For example, hydrogen terminated NCD layers on SiC forms a heterojunction that results in a diode with relatively low turn-on voltage and very low reverse leakage current. This device could greatly improve the forward voltage drop of wide bandgap power diodes.

What is claimed as new and desired to be protected by Letters Patent of the United States is:

1. An article of manufacture comprising a nanocrystalline diamond film in connection with a semiconducting structure,
    wherein the nanocrystalline diamond film forms a UV-transparent and electrically conductive contact with the semiconductor structure
    wherein the article is in a condition of having been made from a suspension of nanodiamond particles of from 1-10 nanometers, and
    wherein the semiconducting structure comprises SiC or GaN.

2. The article of manufacture of claim claim 1 wherein said SiC is SiC epitaxial layers.

3. The article of manufacture of claim 1 wherein said SiC is 4H—SiC.

4. The article of manufacture of claim 1 wherein said nanocrystalline diamond film is doped or undoped.

5. The article of manufacture of claim 4 wherein said doped nanocrystalline diamond film is n-type or p-type doped films.

6. The article of manufacture of claim 5 wherein said n-type doped film is a phosphorus doped film or deuterium irradiated boron-doped film.

7. The article of manufacture of claim 6 wherein said p-type doped film is a boron doped film or an aluminum doped film.

8. The article of manufacture of claim 1 wherein said semiconducting structure is a wide-band gap semiconductor or a narrow-band gap semiconductor.

9. The article of manufacture of claim 1 wherein said nanocrystalline diamond film has a thickness of about 1 µm or less.

10. The article of manufacture of claim 1 wherein said nanocrystalline diamond film has an optical transmission ranging from about 200 nm to about 900 nm in wavelength.

11. A method of making the article of manufacture of claim 1 comprising
    providing an SiC epilayer;
    exposing said SiC epilayer to a suspension nano-diamond of from 1-10 nanometers; and
    depositing nanocrystalline diamond onto said exposing said SiC epilayer.

12. The method of claim 11 wherein said depositing step is conducted using a microwave plasma.

13. The method of claim 12 wherein said microwave plasma technique is carried out at a temperature ranging from about 600° C. to about 800° C.

14. The method of claim 12 further comprising adding diborane gas to said microwave plasma.

15. An article of manufacture comprising a nanocrystalline diamond film in connection with a semiconducting structure, the article comprising nanocrystalline diamond joined to a semiconductor, wherein the junction between the nanocrystalline diamond and the semiconductor exhibits Schottky-like rectifying behavior.

16. The article of claim 15, wherein the article is in a condition of having been made from a suspension of nanodiamond particles of from 1-10 nanometers.

* * * * *